(12) United States Patent
Seo et al.

(10) Patent No.: US 7,728,555 B2
(45) Date of Patent: Jun. 1, 2010

(54) METHOD FOR COMPENSATING STATE OF CHARGE OF BATTERY AND BATTERY MANAGEMENT SYSTEM USING THE SAME

(75) Inventors: Se-Wook Seo, Yongin-si (KR); Han-Seok Yun, Yongin-si (KR); Gye-Jong Lim, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 492 days.

(21) Appl. No.: 11/639,562

(22) Filed: Dec. 14, 2006

(65) Prior Publication Data

US 2007/0139015 A1 Jun. 21, 2007

(30) Foreign Application Priority Data

Dec. 21, 2005 (KR) .................. 10-2005-0127123

(51) Int. Cl.
*H02J 7/00* (2006.01)
*G01N 27/416* (2006.01)
*G08B 27/00* (2006.01)

(52) U.S. Cl. .................. 320/132; 320/149; 324/426; 324/427; 324/428; 324/435; 324/437; 340/636.1; 340/636.21

(58) Field of Classification Search .................. 320/132, 320/149

See application file for complete search history.

(56) References Cited

U.S. PATENT DOCUMENTS 4,193,026 A    3/1980 Finger et al.
6,314,346 B1   11/2001 Kitajima et al.
2002/0030494 A1  3/2002 Araki et al.
2002/0113595 A1  8/2002 Sakai et al.
2003/0231005 A1  12/2003 Kohama et al.

FOREIGN PATENT DOCUMENTS

CN    1311860 A    9/2001
EP    0 560 468 A1  9/1993
EP    1 081 499 A1  3/2001
JP    7-55903       3/1995

OTHER PUBLICATIONS

European Search Report dated Jun. 8, 2007, for EP 061269452.9, in the name of Samsung SDI Co., Ltd.
U.S. Notice of Allowance dated May 19, 2009, for related U.S. Appl. 11/643,218.

*Primary Examiner*—Edward Tso
*Assistant Examiner*—Yalkew Fantu
(74) *Attorney, Agent, or Firm*—Christie, Parker & Hale, LLP

(57) ABSTRACT

The present invention relates to a state of charge (SOC) compensation method for a vehicle using electrical energy, and a battery management system using the SOC compensation method. To determine the SOC of the battery, charge and discharge current of the battery is used to calculate a first SOC of the battery and a first corresponding voltage, a rheobasic voltage is calculated, an integration error corresponding to a difference between the first voltage and the rheobasic voltage is calculated, a SOC compensation factor is added to the first SOC when the integration error is greater than a first threshold value, and a SOC compensation factor is subtracted from the first SOC when the integration error is less than a second threshold value.

15 Claims, 4 Drawing Sheets

METHOD FOR COMPENSATING STATE OF CHARGE OF BATTERY AND BATTERY MANAGEMENT SYSTEM USING THE SAME

CROSS-REFERENCE TO RELATED APPLICATION

This application claims priority to and the benefit of Korean Patent Application No. 10-2005-0127123 filed in the Korean Intellectual Property Office on Dec. 21, 2005, the entire content of which is incorporated herein by reference.

BACKGROUND OF THE INVENTION

1. Field of the Invention

The present invention relates to a battery management system. More particularly, the present invention relates to a state of charge (SOC) compensation method for compensating an SOC of a battery used for a vehicle using electrical energy, and a battery management system using the SOC compensation method.

2. Description of the Related Art

Vehicles using an internal combustion engine of gasoline or heavy oil have caused serious air pollution. To reduce air pollution, various recent efforts for developing electric or hybrid vehicles have been made.

An electric vehicle uses a battery motor operating with electrical energy output by a battery. The electric vehicle mainly uses a battery including a battery pack formed from multiple rechargeable/dischargeable secondary cells. Therefore, it has no emission gases and less noise.

A hybrid vehicle commonly refers to a gasoline-electric hybrid vehicle that uses gasoline to power an internal-combustion engine and an electric battery to power an electric motor. Recently, hybrid vehicles using both an internal-combustion engine and fuel cells and hybrid vehicles using both a battery and fuel cells have been developed. The fuel cells directly obtain electrical energy by generating a chemical reaction while hydrogen and oxygen are continuously provided.

A vehicle using electrical energy charges a battery with residual power from operating an electric generator when power output from the engine is greater than the power needed for driving the vehicle. In turn, when output from the engine is low, the vehicle operates a motor by using battery power to output power. During this time, the battery is discharged.

Since battery performance directly affects a vehicle using electrical energy, good performance is required from each battery cell. Also, it is required to provide a battery management system for measuring voltage and current of the overall battery to efficiently manage charging/discharging operations of each battery cell.

Accordingly, a conventional battery management system (BMS) detects voltage, current, and temperature of a rechargeable battery to estimate the SOC of the battery, and controls the SOC to optimize fuel consumption efficiency.

To perform a stable power assist operation for driving a motor used in a vehicle during acceleration of the vehicle and a stable energy recovery operation (regenerative braking) during deceleration of the vehicle, the BMS controls the SOC level of the battery. The SOC level is controlled to prevent overcharging the battery when the SOC level approaches 70%, and to prevent over-discharge of the battery when the SOC level approaches 50%. That is, the BMS controls the SOC level to be within a range between 50% and 70%.

To control the SOC level, it is required to have a substantially accurate estimate of the SOC level of the charged and discharged battery.

Conventional methods for estimating the SOC level are classified into an SOC estimation method using an integrated current and an SOC estimation method using an open circuit voltage (OCV). In the SOC estimation method using the integrated current, a charge and discharge current value is measured, a value obtained by multiplying the measured current value by a charging efficiency is integrated over a predetermined duration of time to calculate an integrated charging capacity of the battery, and the SOC level is estimated based on the integrated charging capacity. The charge and discharge current is the current generated by the battery during the time the battery is being charged or during the time it is being discharged.

In the SOC estimation method using the OCV, a pair of data including the charge and discharge current and a rechargeable battery terminal voltage corresponding to the charge and discharge current are measured and stored. A line is fitted to the pairs of data that include the voltage V versus the current I using a least square method of curve fitting. The voltage value $V_0$ corresponding to a current value 0, in other words the V intercept of the V-I line, is calculated as an OCV corresponding to the current 0. Finally, the SOC level is estimated based on the OCV of the battery.

However, in the SOC estimation method using the integrated current method, since the charging efficiency required for integrating the current value depends on the SOC level, current value, and temperature, it is difficult to detect the charging efficiency adapted to various conditions. It is also difficult to calculate a self-discharge state when the battery is not being used.

Further, with passing time, a difference between true and estimated values of the SOC is increased in the SOC estimation method using the integrated current, and the SOC level may not be accurately estimated.

SUMMARY OF THE INVENTION

Embodiments of the present invention provide a SOC compensation method for compensating an estimated SOC of a battery so that a substantially accurate SOC is obtained from the estimated SOC that included an error.

Embodiments of the present invention provide a BMS for compensating an estimated SOC of a battery when an error in the estimation of the SOC estimated from an integrated capacity of the battery exceeds a threshold value, and providing the more accurate estimate of the SOC of the battery to an engine control unit (ECU) of a vehicle.

One embodiment of the present invention provides a SOC compensation method for compensating an SOC of a battery used in a battery management system. In the SOC compensation method, a) a charge and discharge current of the battery is used to calculate a first SOC of the battery and a first voltage corresponding to the first SOC; b) the charge and discharge current of the battery, a voltage of the battery, and an internal resistance of the battery are used to calculate a rheobasic voltage of the battery; c) an integration error corresponding to a difference between the first voltage and the rheobasic voltage is calculated; d) it is determined whether the calculated integration error is within a predetermined effective range; and e) when the integration error falls outside the effective range, a SOC compensation factor (here, the SOC compensation factor is set according to whether the integration error exceeds or is below the effective range) is added to the first SOC to compensate the first SOC so that the compensated SOC is within an SOC range corresponding to the effective range. The SOC compensation factor may be added to or subtracted from the first SOC.

In one embodiment, in d), it is determined whether the integration error is greater than a first threshold value of the predetermined effective range, it is determined whether the integration error is less than a second threshold value of the predetermined effective range when the integration error is not greater than the first threshold value. In one alternative, it is indicated that the integration error is greater than the first threshold value when the integration error is greater than the first threshold value, it is indicated that the integration error is less than the second threshold value when the integration error is less than the second threshold value, and a normal state is indicated when the integration error is not greater than the first threshold value and is not less than the second threshold value.

In one embodiment, in e), the SOC is compensated by using a first SOC compensation factor when the integration error is greater than the first threshold value, and it is compensated by using a second SOC compensation factor when the integration error is less than the second threshold value.

In one embodiment, the first threshold value is a positive value, and the second threshold value is a negative value, and the first and second threshold values have the same absolute value. The absolute value of the first SOC compensation factor is greater than the absolute value of the second SOC compensation factor.

In one embodiment, in a), an integrated current is measured in a current integration method using the charge and discharge current of the battery, the first SOC corresponding to the measured integrated current is calculated, and the calculated first SOC is applied to a predetermined OCV table to obtain the first voltage.

One embodiment of the present invention provides a driving method for a battery management system connected to an ECU of a vehicle using electrical energy. According to the driving method: a) a charge and discharge current of a battery and a battery voltage are measured; b) the charge and discharge current of the battery is used to calculate a first SOC and a first voltage corresponding to the first SOC; c) the charge and discharge current of the battery, the battery voltage, and an internal resistance of the battery are used to calculate a rheobasic voltage of the battery; d) an integration error corresponding to a difference between the first voltage and the rheobasic voltage is calculated; e) it is determined whether the calculated integration error is within a predetermined effective range; f) when the integration error falls outside the effective range, a SOC compensation factor (here, the SOC compensation factor is set according to whether the integration error exceeds or is below the effective range) is added to the first SOC to compensate the first SOC so that the compensated SOC is within an SOC range corresponding to the effective range; and g) the compensated SOC is output to the EUC as a present SOC of the battery.

In one embodiment, in e), it is determined whether the integration error is greater than a first threshold value of the predetermined effective range, it is determined whether the integration error is less than a second threshold value of the predetermined effective range when the integration error is not greater than the first threshold value. In one alternative, it is indicated that the integration error is greater than the first threshold value when the integration error is greater than the first threshold value, it is indicated that the integration error is less than the second threshold value when the integration error is less than the second threshold value, and it is indicated that a normal state exists when the integration error is not greater than the first threshold value and is not less than the second threshold value.

In one embodiment, in f), the SOC is compensated by using a first SOC compensation factor when the integration error is greater than the first threshold value, and is compensated by using a second SOC compensation factor when the integration error is less than the second threshold value.

In one embodiment, the first threshold value is a positive value, and the second threshold value is a negative value, and the first and second threshold values have the same absolute value. The first SOC compensation factor is greater than the second SOC compensation factor.

In one alternative, in b), an integrated current is measured by a current integration method using the charge and discharge current of the battery, the first SOC corresponding to the measured integrated current is calculated, and the calculated first SOC is applied to a predetermined OCV table to calculate the first voltage.

A battery management system according to an embodiment of the present invention manages a battery and outputs SOC of the battery to an ECU of a vehicle that is adapted to use electrical energy. The battery management system includes an integration SOC calculator, an integration voltage calculator, a rheobasic voltage calculator, an effective range determination unit, an SOC compensating unit, and an SOC outputting unit. The integration SOC calculator uses a charge and discharge current of the battery to calculate a first SOC. The integration voltage calculator calculates an integrated voltage corresponding to the first SOC. The rheobasic voltage calculator uses a battery voltage, the charge and discharge current, and an internal resistance of the battery to calculate a rheobasic voltage. The effective range determination unit uses the integrated voltage and the rheobasic voltage to calculate an integration error, determines whether the calculated integration error is within a predetermined effective range, and outputs an effective range excess signal and an effective range below signal. The SOC compensating unit compensates the first SOC by using a first SOC compensation factor when receiving the effective range excess signal and compensates the first SOC by using a second SOC compensation factor, which is different from the first SOC compensation factor, when receiving the effective range below signal, so that the compensated SOC is within an SOC range corresponding to the effective range. The SOC outputting unit outputs an output of the SOC compensating unit to the ECU as a present SOC of the battery.

In one embodiment, the effective range determination unit outputs the effective range excess signal when the integration error is greater than the first threshold value, outputs the effective range below signal when the integration error is less than the second threshold value, and determines a normal state when the integration error is not greater than the first threshold value and is not less than the second threshold value.

In one embodiment, the SOC outputting unit outputs the first SOC to the ECU as the present SOC of the battery when informed that the integration error is in the normal state.

In one embodiment, the first threshold value is a positive value, and the second threshold value is a negative value, and the first and second threshold values have the same absolute value. An absolute value of the first SOC compensation factor is greater than that of the second SOC compensation factor.

In one embodiment, the integration SOC calculator uses a current integration method using the charge and discharge current of the battery to measure an integrated current, calculates the first SOC corresponding to the measured integrated current, and applies the calculated first SOC to a predetermined OCV table to calculate the first voltage.

DETAILED DESCRIPTION OF THE EMBODIMENTS

A SOC compensation method of a battery and a battery management system using the SOC compensation method according to an exemplary embodiment of the present invention are described with reference to the figures.

Figure 1:
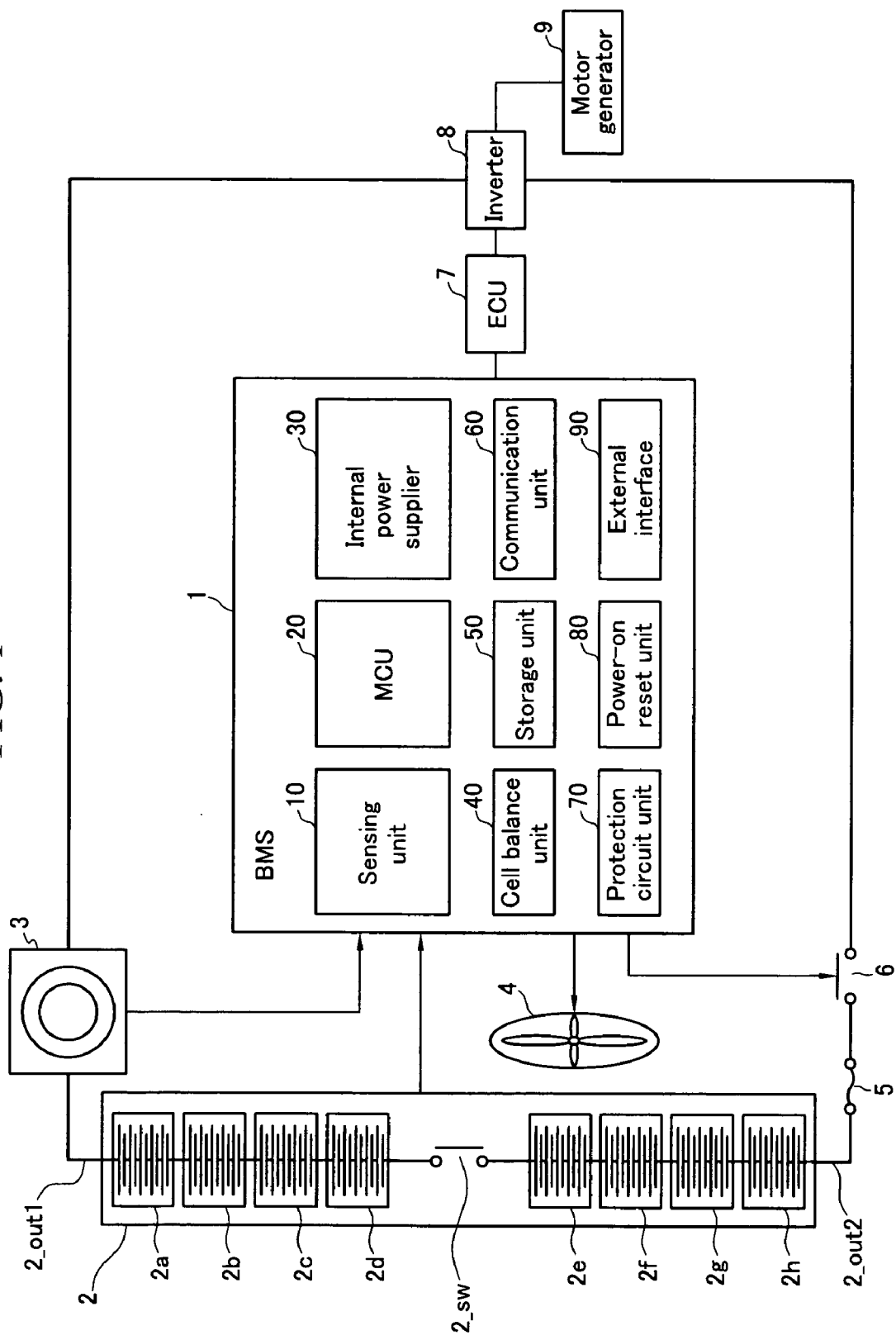
FIG. 1 shows a schematic diagram of a configuration of a vehicle system using electrical energy according to an exemplary embodiment of the present invention.

As shown in FIG. 1, the vehicle system includes a BMS 1, a battery 2, a current sensor 3, a cooling fan 4, a fuse 5, a main switch 6, an ECU 7, an inverter 8, and a motor generator 9.

The battery 2 includes a number of sub-packs 2a to 2h each having multiple battery cells coupled in series to each other. The battery 2 also includes a first output terminal 2_out1, a second output terminal 2_out2, and a safety switch 2_sw provided between the sub-pack 2d and the sub-pack 2e. One exemplary embodiment is shown that includes eight sub-packs 2a to 2h with each sub-pack shown as a group of battery cells. The invention is not however limited to the exemplary embodiment shown. The safety switch 2_sw is manually turned on/off to guarantee worker safety when performing maintenance and various other operations on the battery or when replacing the battery. In a first exemplary embodiment of the present invention, the safety switch 2_sw is provided between the sub-pack 2d and the sub-pack 2e but the location of the safety switch may be varied in other embodiments. The first output terminal 2_out1 and the second output terminal 2_out2 are coupled to the inverter 8.

The current sensor 3 measures an output current value of the battery 2 and outputs the measured output current value to a sensing unit 10 of the BMS 1. The current sensor 3 may be a Hall current transformer using a Hall element to measure a current value, and outputs an analog current signal corresponding to the measured current value.

The cooling fan 4 removes the heat generated by charging and discharging the battery 2 in response to a control signal provided by the BMS 1. Cooling the battery reduces or prevents deterioration of the battery 2 due to temperature increase, and thereby reduces deterioration of charging and discharging efficiency.

The fuse 5 prevents an overflowing current, which may be caused by a disconnection or a short circuit of the battery 2, from being transmitted to the BMS 1 and back to the battery 2. When over-current is generated, the fuse 5 is disconnected to interrupt the current.

The main switch 6 turns the battery 2 on/off in response to a control signal provided by the BMS 1 or a control signal provided by the ECU 7 when an over-voltage, an over-current, a high temperature, or a similarly undesirable condition occurs.

The BMS 1 includes a sensing unit 10, a main control unit (MCU) 20, an internal power supplier 30, a cell balance unit 40, a storage unit 50, a communication unit 60, a protection circuit unit 70, a power-on reset unit 80, and an external interface 90.

The sensing unit 10 measures an overall battery current, an overall battery voltage, each battery cell voltage, each battery cell temperature, and a peripheral temperature, converts the measured values into digital data, and transmits the digital data to the MCU 20.

The MCU 20 estimates a SOC and a state of health (SOH) of the battery 2 based on the overall battery current, the overall battery voltage, each cell voltage, each cell temperature, and the peripheral temperature. The MCU 20, then generates information on a state of the battery 2, and transmits the generated information to the ECU 7. Accordingly, the ECU 7 of the vehicle charges and discharges the battery 2 based on the SOC and SOH transmitted from the MCU 20.

The internal power supplier 30 supplies power to the BMS 1 by using a backup battery. The cell balance unit 40 balances the state of charge of each cell. That is, cells sufficiently charged are discharged, and cells with relatively lower charge are further charged.

The storage unit 50 stores the present values of SOC and SOH data when the power source of the BMS 1 is turned off. An electrically erasable programmable read-only memory (EEPROM) may be used to implement the storage unit 50. The communication unit 60 communicates with the ECU 7 of the vehicle.

The protection circuit unit 70 uses a firmware to protect the battery 2 from shocks, over-flowed currents, and low voltages. The power-on reset unit 80 resets the overall system when the power source of the BMS 1 is turned on. The external interface 90 couples auxiliary devices for the BMS, such as the cooling fan 4 and main switch 6, to the MCU 20. The invention, however, is not limited to the exemplary embodiment shown that includes the cooling fan 4 and the main switch 6 as the BMS assistance devices and may include other or additional BMS assistance devices.

The ECU 7 determines a torque state based on information from the accelerator and the break and also based on the vehicle speed, and controls an output of the motor generator 9 so that the output corresponds to the torque information. The ECU 7 controls switching operation of the inverter 8 that controls the output of the motor generator 9. In addition, the ECU 7 receives the SOC of the battery 2 from the MCU 20 through the communication unit 60, and controls the SOC level of the battery 2 to be at a target level (e.g., 55%).

For example, when the SOC level transmitted from the MCU 20 is lower than 55%, the ECU 7 controls a switch of the inverter 8 to output power toward the battery 2 to charge the battery 2. In this case, a battery current I in each subpack has a negative value (−). When the SOC level is greater than 55%, the ECU 7 controls the switch of the inverter 8 to output power toward the motor generator 9 to discharge the battery 2. In this case, the battery current I has a positive value (+).

The inverter 8 controls the battery 2 to be charged or discharged in response to the control signal of the ECU 7.

The motor generator 9 uses the electrical energy of the battery to drive the vehicle based on the torque information transmitted from the ECU 7.

Accordingly, because the ECU 7 prevents the battery 2 from being overcharged or over-discharged by charging and discharging the battery 2 based on the SOC level, the battery 2 may be efficiently used for a longer time. However, it is difficult to measure an actual SOC level of the battery 2 when the battery 2 is mounted on the vehicle. Therefore, the BMS 1 is required to estimate the SOC level with substantial accuracy by using the battery current and battery voltage sensed by the sensing unit 10 and to transmit the estimated SOC to the ECU 7.

Figure 2:
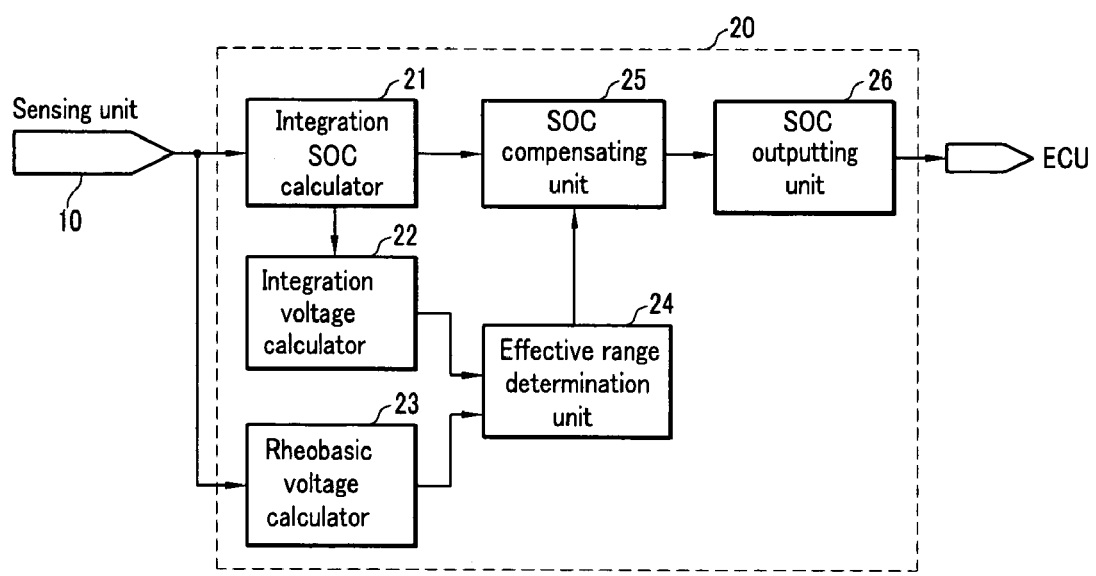
FIG. 2 shows a schematic diagram of a configuration of a main control unit (MCU) of a BMS of the vehicle system of FIG. 1.

The MCU, that is used for outputting the SOC level, will now be described in further detail. FIG. 2 shows a schematic diagram of a configuration of the MCU 20 of the BMS 1.

As shown in FIG. 2, the MCU 20 includes an integration SOC calculator 21, an integration voltage calculator 22, a rheobasic voltage calculator 23, an effective range determination unit 24, an SOC compensating unit 25, and an SOC outputting unit 26.

The integration SOC calculator 21 employs a SOC estimation method to calculate the SOC level of the battery using the integrated capacity of the battery. For example, the integration SOC calculator 21 measures and determines a charging and discharging current level provided from the sensing unit 10. In one embodiment, the current value is a positive value when the battery 2 is charged, and a negative value when the battery 2 is discharged. When determining the SOC level, the integration SOC calculator 21 multiplies the current value by the charging efficiency, integrates the product of multiplying the current value by the charging efficiency over a predetermined time period to calculate the integrated capacity of the battery, and calculates the SOC level based on the integrated capacity.

The integration SOC calculator 21 adds a product of the charge or discharge current and a time increment ($I \times \Delta t$) to a previous integrated SOC level to calculate an updated SOC level, which is provided as the present integrated SOC such that:

present integrated $SOC$=previous integrated $SOC$+ ($I \times \Delta t$)

Here, I denotes a measured current and the time increment $\Delta t$ denotes the time from a previous cycle to a present cycle ($\Delta t$ is conventionally 1 cycle time of a control loop).

The integration voltage calculator 22 stores the present integrated SOC level in an OCV table, and uses the OCV table to calculate an integrated voltage Vsoc corresponding to the present integrated SOC level received from the integration SOC calculator 21. The OCV table will be described below with reference to FIG. 3.

The rheobasic voltage calculator 23 uses the overall battery current, the overall battery voltage, the cell voltage, the cell temperature, and the peripheral temperature, and calculates a present value of the battery rheobasic voltage $V_0$.

The rheobasic voltage Vo corresponds to the open circuit voltage of the battery when the SOC level of the battery is substantially zero. An open circuit condition corresponds to a substantially zero current condition.

The rheobasic voltage $V_0$ is obtained by adding the voltage drop in an internal battery resistance R to the battery output voltage.

The rheobasic voltage calculator 23 uses the received voltage, current, and temperature to calculate the internal resistance R of the battery. Then, the rheobasic voltage calculator 23 calculates the rheobasic voltage $V_0$ from the battery voltage V that is output by the sensing unit 10 by using the equation: $V_0 = V + R \times I$.

The effective range determination unit 24 determines whether there is an error in the integrated SOC output from the integration SOC calculator 21, and determines whether the error is within a permitted range for the SOC. Accordingly, the effective range determination unit 24 receives an integrated voltage Vsoc output from the integration voltage calculator 22 and the rheobasic voltage $V_0$ output from the rheobasic voltage calculator 23, calculates an error component (hereinafter, referred to as an "integration error") from a difference between the integrated voltage Vsoc and the rheobasic voltage $V_0$ that are received at the same time, and compares the calculated integration error to a predetermined effective range.

The integration error $\Delta V_0$ is calculated from Equation 1 below:

$$\Delta V_0 = Vsoc - V_0$$

Accordingly, the integration error $\Delta V_0$ has a positive value when the integrated voltage Vsoc is greater than the rheobasic voltage $V_0$, and a negative value when the integrated voltage Vsoc is less than the rheobasic voltage $V_0$.

The predetermined effective range is set as $-\alpha < \Delta V_0 < \alpha$ in the effective range determination unit 24. Hereinafter, $\Delta$ will be referred to as a maximum threshold value and $-\Delta$ will be referred to as a minimum threshold value, the minimum threshold value having a negative value.

Accordingly, the effective range determination unit 24 determines whether the integration error $\Delta V_0$ is within the effective range, whether the integration error $\Delta V_0$ is greater than the maximum threshold value $\alpha$, or whether the integration error $\Delta V_0$ is less than the minimum threshold value $-\Delta$. The integration error is greater than $\alpha$ when the integrated voltage Vsoc is greater than rheobasic voltage $V_0$, and the integration error $\Delta V_0$ is less than $-\Delta$ when the integrated voltage Vsoc is less than the rheobasic voltage $V_0$. The effective range determination unit 24 subsequently varies its output according to the determined result, and provides the output to the SOC compensating unit 25.

The SOC compensating unit 25 determines, according to the output of the effective range determination unit 24, whether to compensate the integrated SOC received from the integration SOC calculator 21. The SOC compensating unit 25, may subsequently compensate the SOC by using a predetermined SOC compensation factor corresponding to the integration error when it is determined that the integrated SOC should be compensated. The integrated SOC obtained from the SOC compensating unit 25 may be called the compensated SOC.

That is, the SOC compensating unit 25 performs a compensation by subtracting a first SOC compensation factor, $\epsilon$, from the integrated SOC when the integration error $\Delta V_0$ is not within the effective range and is greater than the maximum threshold value $\alpha$, and performs the compensation by adding a second SOC compensation factor, $\beta$, to the integrated SOC when the integration error $\Delta V_0$ is lower than the minimum threshold value $-\alpha$.

Here, $\epsilon$, the first SOC compensation factor, is different from $\beta$, the second SOC compensation factor. More particularly, the first SOC compensation factor is set to be greater than the second SOC compensation factor or $\epsilon > \beta$.

Problems occur when an actual value of $V_0$ is greater than an integrated voltage Vsoc but the actual value of $V_0$ is not correctly estimated. In this situation, the integration error $\Delta V_0$ may not appear as negative as it really is and the SOC may be displayed as being sufficient when an actual remaining SOC is insufficiently low.

The SOC outputting unit 26 outputs the SOC level provided by the SOC compensating unit 25 to the ECU 7. The initial SOC value is subsequently reset to prepare the system for a next round of SOC estimation and compensation.

Figure 3:
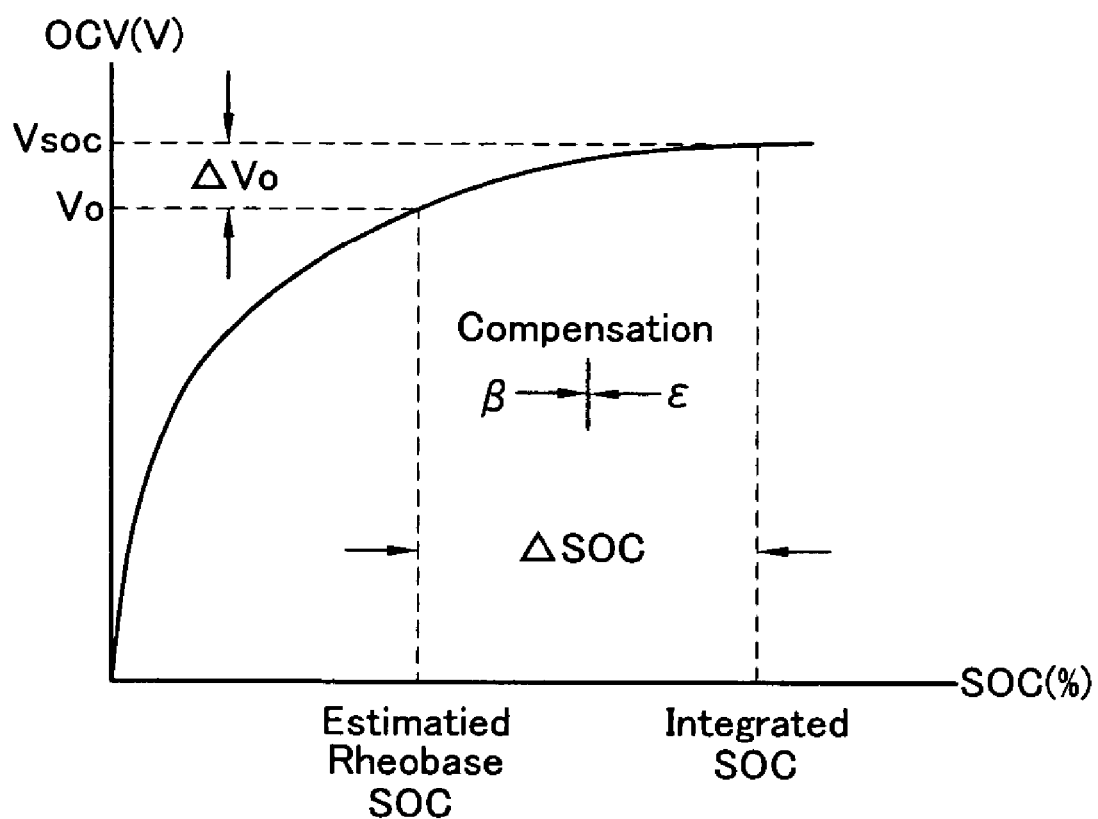
FIG. 3 shows a graph representing an OCV of a battery as a function of a SOC of the battery and corresponding to an OCV versus SOC table. OCV is in units of volts and SOC is a percentage value.

FIG. 3 shows a graph representing a relationship between the SOC and the OCV corresponding to the SOC and OCV table. The open circuit voltage of the battery is plotted against the state of charge of the battery using the values in the table establishing a correspondence between the OCV and SOC values. As shown in FIG. 3, by using the curve of the open circuit voltage against the state of charge, the state of charge corresponding to a given open circuit voltage may be obtained. Therefore, when an open circuit voltage is provided, the corresponding state of charge of the battery may be found from the curve of FIG. 3. Conversely, when the state of charge is provided, the open circuit voltage may be obtained for the battery. For example, when the integrated voltage Vsoc or the rheobasic voltage $V_0$ are provided their corresponding SOC values of integrated SOC and estimated rheobase SOC may be found from the plot. Conversely, when the integrated SOC or the estimated rheobase SOC are provided, the voltages Vsoc and $V_0$ may be found from the plot.

Figure 4:
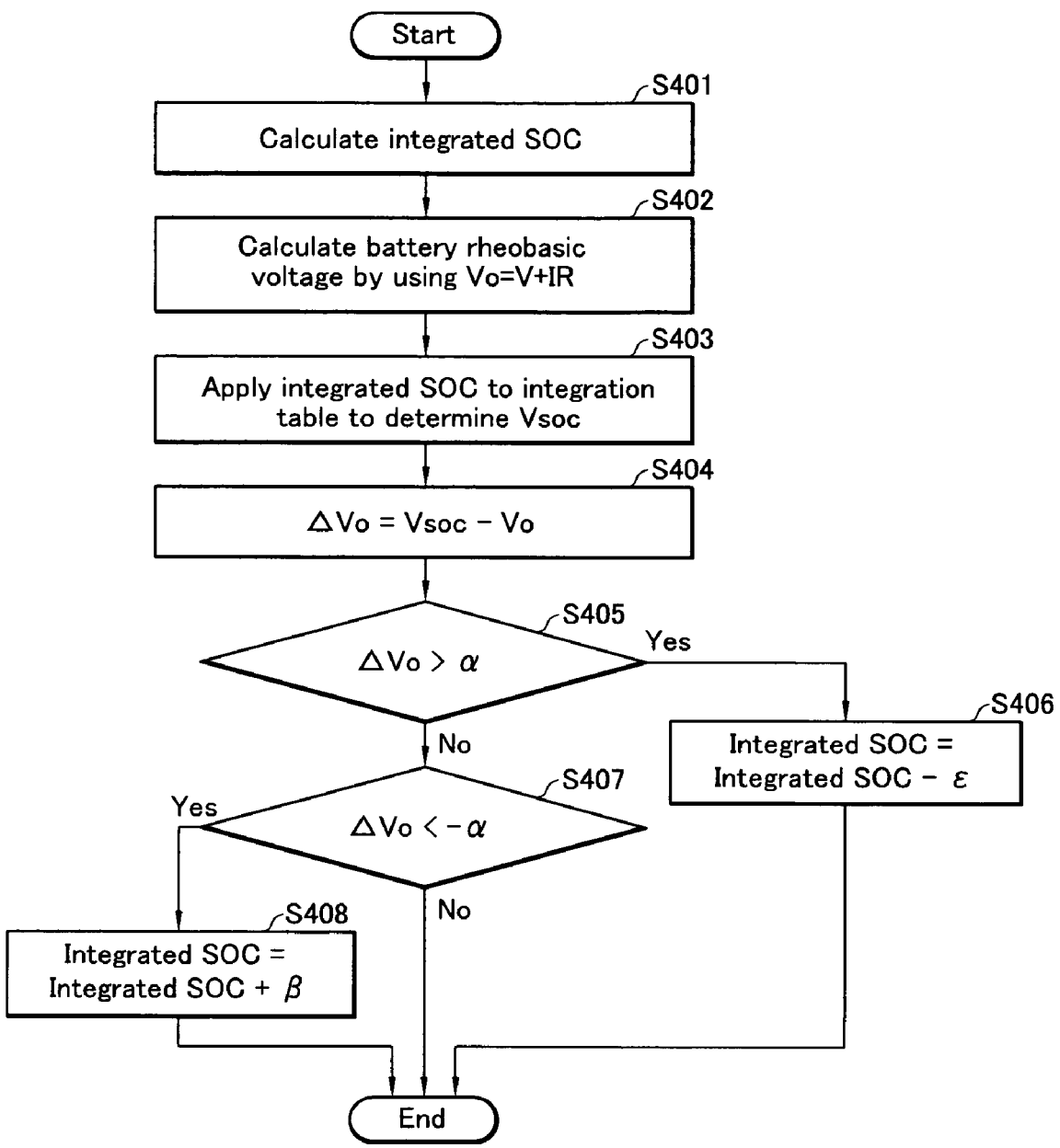
FIG. 4 shows a flowchart representing an SOC compensation method for a battery according to embodiments of the present invention.
Figure 3:
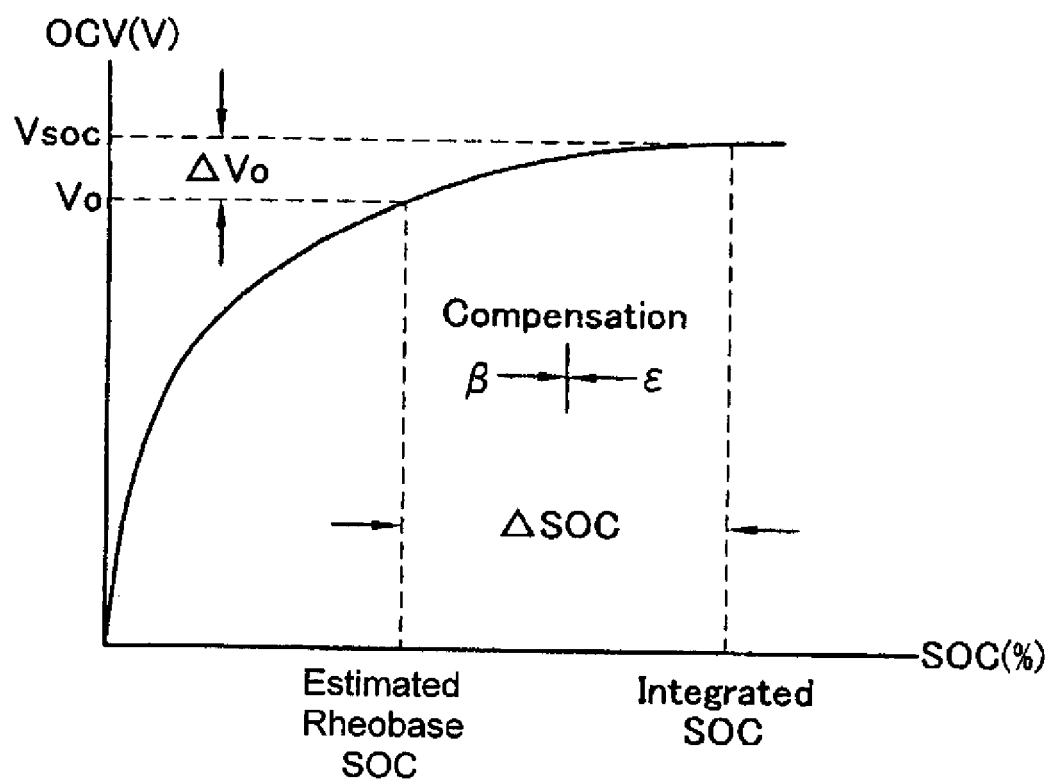

The SOC compensation method according to the embodiments of the present invention is now described with reference to FIG. 4 showing a flowchart representing the method of compensating state of charge of the battery.

In step S401, the integration SOC calculator 21 integrates the current values received from the sensing unit 10 over a predetermined period of time to determine the integrated current, calculates the integrated SOC by using the integrated current, and provides the calculated value of the integrated SOC to the integration voltage calculator 22 and the SOC compensating unit 25.

In step S402, that may occur at the same time as step S401, the rheobasic voltage calculator 23 uses the overall battery current, the overall battery voltage, each battery cell voltage, each cell temperature, and the peripheral temperature to determine the internal resistance R of the battery and the current I through the battery, and calculates the rheobasic voltage $V_0$ according to the equation $V_0 = V + I \times R$ where V is the sensed overall battery voltage.

The rheobasic voltage calculator 23 provides the calculated rheobasic voltage $V_0$ to the effective range determination unit 24.

In step S403, when receiving the integrated SOC, the integration voltage calculator 22 uses the received integrated SOC to determine the integrated voltage Vsoc from the stored OCV table, and provides the integrated voltage Vsoc to the effective range determination unit 24.

In step S404, the effective range determination unit 24 subtracts the rheobasic voltage $V_0$ from the integrated voltage Vsoc input at the same time, and calculates the integration error $\Delta V_0$.

In step S405, the effective range determination unit 24 compares the integration error $\Delta V_0$ to the effective range $[-\alpha, \alpha]$ by determining whether the integration error $\Delta V_0$ is greater than the maximum threshold value $\alpha$.

If it is determined in step S405 that the integration error $\Delta V_0$ is greater than the maximum threshold value $\alpha$, the effective range determination unit 24 outputs a positive excess signal to the SOC compensating unit 25 and the process moves to step S406.

In step S406, in response to the positive excess signal, the SOC compensating unit 25 performs the SOC compensation by subtracting $\epsilon$, the first SOC compensation factor, from the integrated SOC received from the integration SOC calculator 21 (i.e., compensated integrated SOC=integrated SOC$-\epsilon$). The SOC compensating unit 25 provides the resulting compensated integrated SOC to the SOC outputting unit 26. The compensated integrated SOC may also be called the compensated SOC.

If it is determined in step S405 that the integration error $\Delta V_0$ is less than the maximum threshold value $\alpha$, the process moves to step S407.

In step S407, the effective range determination unit 24 compares the integration error $\Delta V_0$ to the minimum threshold value $-\alpha$, and determines whether the integration error $\Delta V_0$ is less than the minimum threshold value $-\alpha$.

If it is determined in step S407 that the integration error $\Delta V_0$ is less than the minimum threshold value $-\alpha$, the effective range determination unit 24 outputs a negative excess signal to the SOC compensating unit 25 and the process moves to step S408.

In step S408, in response to the negative excess signal, the SOC compensating unit 25 performs the SOC compensation by adding $\beta$, the second SOC compensation factor, to the integrated SOC received from the integration SOC calculator 21 (i.e., compensated integrated SOC=integrated SOC$+\beta$). The SOC compensating unit 25 provides the resulting compensated integrated SOC to the SOC outputting unit 26. Again, the compensated integrated SOC thus obtained is also called the compensated SOC.

In addition, when it is determined in step S407 that the integration error $\Delta V_0$ is not less than the minimum threshold value $-\alpha$, the effective range determination unit 24 determines the charge state of the battery to be normal and outputs a normal signal to the SOC compensating unit 25. As a result, the SOC compensating unit 25 provides the integrated SOC from the integration SOC calculator 21 to the SOC outputting unit 26 without compensation.

Operations of the effective range determination unit 24 and the SOC compensating unit 25 will now be described with reference to FIG. 3. When the range of the integration error $\Delta V_0$, shown in the plot of FIG. 3, is within the effective range $[-\alpha, \alpha]$ and the integrated SOC falls outside a corresponding effective SOC range, ASOC, then, $\epsilon$ is subtracted from the integrated SOC or $\beta$ is added to the integrated SOC so that the difference between the integrated SOC and the estimated rheobase SOC moves back to within the effective SOC range, ASOC, corresponding to $\Delta V_0$.

Here, $\epsilon$ and $\beta$ are values used for compensating the integrated SOC when the difference between the integrated SOC and the estimated rheobase SOC exceeds a set error to bring the integrated SOC to within the effective SOC range ASOC that corresponds to the effective range $[-\alpha, \alpha]$ for the integration error $\Delta V_0$. Compensating is necessary also because the error for estimating the SOC by using the current integration method increases as time goes on and the integrated SOC is obtained corresponding to a current that is integrated over a longer period of time.

Accordingly, in setting the first SOC compensation factor, $\epsilon$, and the second SOC compensation factor, $\beta$, the values of $\epsilon$ and $\beta$ are set to be relatively higher when the periodic intervals of time for the compensation are set to be long. Conversely, values of $\epsilon$ and $\beta$ are set to be relatively lower when the intervals for the compensation are set to be short.

Because the integration error of the SOC increases as the integration time increases, the SOC compensation factors may be set to be increased according to the SOC integration time.

The above-described methods and apparatuses are not only realized by the exemplary embodiment of the present invention, but are also intended to be realized by a program for realizing functions corresponding to the configuration of the exemplary embodiment of the present invention or a recording medium for recording the program.

As described above, according to one exemplary embodiment of the present invention, a difference between actual and estimated rheobase SOC values is generated as time goes on by using the integrated current of the battery. The difference between the two states of charge is determined by finding a difference between the integrated voltage and the rheobasic voltage of the battery. The integrated state of charge is then compensated to maintain the difference between the estimated and integrated states of charge within an allowed range. Therefore, the SOC of the battery may be detected with substantial accuracy.

In addition, because an allowed range for the integration error is provided, system processes are not overloaded.

Further, the compensation factors are provided asymmetrically to prevent an inaccurate estimate of the integration error from impacting the compensation of the SOC. This safeguard is included because the actual rheobase voltage $V_O$ is often overestimated and the estimated rheobase voltage used to calculate the integration error is larger than the actual value of the rheobase voltage. The resulting integration error, then, appears less positive or more negative than it is in reality. Corresponding to the error in calculating the actual rheobase voltage, the estimated rheobase SOC level erroneously appears to be higher than the actual SOC level corresponding to the rheobase voltage more often than it erroneously appears to be lower than the actual SOC value. Therefore, if the integrated SOC falls above the effective SOC range, it is pulled back by subtracting a larger compensation factor ($\epsilon$) and when the integrated SOC falls below the range, it is pushed forward by adding a smaller compensation factor ($\beta$).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A driving method for a battery management system connected to an engine control unit of a vehicle using electrical energy, the driving method comprising:
   a) measuring a charge and discharge current of a battery and a battery voltage;
   b) calculating a first state of charge and a first voltage corresponding to the first state of charge using the charge and discharge current of the battery;
   c) calculating a rheobasic voltage of the battery using the charge and discharge current of the battery, the battery voltage, and an internal resistance of the battery;
   d) calculating an integration error corresponding to a difference between the first voltage and the rheobasic voltage;
   e) determining whether the integration error is within a predetermined effective range;
   f) when the integration error falls outside the predetermined effective range, compensating the state of charge by subtracting a first state of charge compensation factor to the first state of charge when the integration error is above the predetermined effective range, and by adding a second state of charge compensation factor different from the first state of charge compensation factor to the first state of charge when the integration error is below the predetermined effective range, to obtain a compensated state of charge so that the compensated state of charge is within a state of charge range corresponding to the predetermined effective range; and
   g) outputting the compensated state of charge to the engine control unit as a present state of charge of the battery.

2. The driving method of claim 1, wherein e) includes:
   determining whether the integration error is greater than a first threshold value;
   determining whether the integration error is less than a second threshold value, when the integration error is not greater the first threshold value;
   when the integration error is greater than the first threshold value, indicating that the integration error is greater than the first threshold value;
   when the integration error is less than the second threshold value, indicating that the integration error is less than the second threshold value; and
   when the integration error is not greater than the first threshold value and is not less than the second threshold value, indicating a normal state,
   wherein the first threshold value and the second threshold value are limits of the predetermined effective range.

3. The driving method of claim 2, wherein f) includes:
   when the integration error is greater than the first threshold value, compensating the state of charge by using the first state of charge compensation factor, and
   when the integration error is less than the second threshold value, compensating the state of charge by using the second state of charge compensation factor.

4. The driving method of claim 2, wherein the first threshold value is a positive value and the second threshold value is a negative value.

5. The driving method of claim 4, wherein the first threshold value and the second threshold value have a same absolute value.

6. The driving method of claim 1, wherein an absolute value of the first state of charge compensation factor is greater than an absolute value of the second state of charge compensation factor.

7. The driving method of claim 2, wherein b) includes:
   measuring an integrated current by a current integration method using the charge and discharge current of the battery;
   calculating the first state of charge corresponding to the integrated current; and
   calculating the first voltage by applying the first state of charge to a predetermined open circuit voltage table.

8. The driving method of claim 2, wherein in g), when a normal state is indicated, the first state of charge is output to the engine control unit as the present state of charge of the battery.

9. A battery management system for managing a battery and outputting a state of charge of the battery to an engine control unit of a vehicle using electrical energy, the battery management system comprising:
   an integration state of charge calculator for calculating a first state of charge using a charge and discharge current of the battery;
   an integration voltage calculator for calculating an integrated voltage corresponding to the first state of charge;
   a rheobasic voltage calculator for calculating a rheobasic voltage using a battery voltage, the charge and discharge current of the battery, and an internal resistance of the battery;
   an effective range determination unit for calculating an integration error using the integrated voltage and the rheobasic voltage, determining whether the integration error is within a predetermined effective range, and outputting an effective range excess signal and an effective range below signal;
   a state of charge compensating unit for compensating the first state of charge using a first state of charge compensation factor when receiving the effective range excess signal and compensating the first state of charge using a second state of charge compensation factor different from the first state of charge compensation factor when receiving the effective range below signal to obtain a compensated state of charge so that the compensated state of charge falls within a state of charge range corresponding to the predetermined effective range; and a state of charge outputting unit for outputting the compensated state of charge output by the state of charge compensating unit to the engine control unit as a present state of charge of the battery.

10. The battery management system of claim 9, wherein the effective range determination unit outputs the effective range excess signal when the integration error is greater than a first threshold value, outputs the effective range below signal when the integration error is less than a second threshold value, and outputs a normal state signal when the integration error is not greater than the first threshold value and is not less than the second threshold value.

11. The battery management system of claim 9, wherein the state of charge outputting unit outputs the first state of charge to the engine control unit as the present state of charge of the battery when the integration error is in a normal state not being greater than a first threshold value and not being less than a second threshold value.

12. The battery management system of claim 10, wherein the first threshold value is a positive value, and the second threshold value is a negative value.

13. The battery management system of claim 12, wherein the first threshold value and the second threshold value have a same absolute value.

14. The battery management system of claim 12, wherein an absolute value of the first state of charge compensation factor is greater than an absolute value of the second state of charge compensation factor.

15. The battery management system of claim 9, wherein the integration state of charge calculator uses a current integration method using the charge and discharge current of the battery to measure an integrated current, calculates the first state of charge corresponding to the measured integrated current, and applies the first state of charge to a predetermined open circuit voltage table to calculate the first voltage.

* * * * *

UNITED STATES PATENT AND TRADEMARK OFFICE
CERTIFICATE OF CORRECTION

| | | |
|---|---|---|
| PATENT NO. | : 7,728,555 B2 | Page 1 of 2 |
| APPLICATION NO. | : 11/639562 | |
| DATED | : June 1, 2010 | |
| INVENTOR(S) | : Se-Wook Seo et al. | |

It is certified that error appears in the above-identified patent and that said Letters Patent is hereby corrected as shown below:

On the Title Page

(56) References Cited
OTHER PUBLICATIONS, line 4

After "11/643,218,"
Insert -- noting listed reference in this IDS. --

(56) References Cited
OTHER PUBLICATIONS

Insert -- Patent Abstracts of Japan for Publication No. 07-055903; dated March 3, 1995 in the name of Kazuhiro Hara --

In the Drawings
FIG. 3, Sheet 3 of 4, (Including the Title Page)

Delete Drawing Sheet 3 and substitute therefore the Drawing Sheet, consisting of FIG. 3, as shown on the attached page Delete "Estimatied" Insert -- Estimated --

Signed and Sealed this
Twenty-ninth Day of November, 2011

David J. Kappos
*Director of the United States Patent and Trademark Office*